(12) United States Patent
Lee et al.

(10) Patent No.: US 11,823,622 B2
(45) Date of Patent: Nov. 21, 2023

(54) PIXEL AND DISPLAY DEVICE INCLUDING THE SAME

(71) Applicant: SAMSUNG DISPLAY CO., LTD., Yongin-si (KR)

(72) Inventors: Hwa Rang Lee, Yongin-si (KR); Kwi Hyun Kim, Yongin-si (KR); Sang Yong No, Yongin-si (KR); Ji Yeon Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/519,908

(22) Filed: Nov. 5, 2021

(65) Prior Publication Data

US 2022/0293052 A1 Sep. 15, 2022

(30) Foreign Application Priority Data

Mar. 10, 2021 (KR) .................. 10-2021-0031689

(51) Int. Cl.
*G09G 3/3233* (2016.01)
*H01L 27/15* (2006.01)
*G09G 3/20* (2006.01)

(52) U.S. Cl.
CPC ......... *G09G 3/3233* (2013.01); *G09G 3/2007* (2013.01); *H01L 27/156* (2013.01); *G09G 2300/0426* (2013.01); *G09G 2300/0842* (2013.01); *G09G 2310/08* (2013.01); *G09G 2320/0242* (2013.01)

(58) Field of Classification Search
None
See application file for complete search history.

(56) References Cited

U.S. PATENT DOCUMENTS

| 9,202,853 | B2 | 12/2015 | Kim et al. | |
| 9,711,084 | B2 | 7/2017 | Uetake | |
| 10,139,643 | B2* | 11/2018 | Ryu | H04N 13/356 |
| 10,140,903 | B2* | 11/2018 | Lee | G09G 3/3233 |
| 2004/0252085 | A1* | 12/2004 | Miyagawa | G09G 3/3233 |
| | | | | 345/76 |

(Continued)

FOREIGN PATENT DOCUMENTS

| JP | 6285158 B2 | 2/2018 |
| KR | 10-0699997 B1 | 3/2007 |

(Continued)

*Primary Examiner* — Kenneth Bukowski
(74) *Attorney, Agent, or Firm* — Lewis Roca Rothgerber Christie LLP

(57) ABSTRACT

Provided herein may be a pixel. The pixel may include a driving transistor including a gate electrode coupled to a first node, a first electrode coupled to a first power line, and a second electrode coupled to a second node, a control transistor including a gate electrode coupled to the first node, a first electrode coupled to the second node, and a second electrode that is different from the first electrode, a first emission unit including at least one light-emitting element coupled between the second electrode of the control transistor and a second power line, and a second emission unit including at least one light-emitting element coupled between the second node and the second power line, wherein the second electrode of the control transistor is coupled to a first electrode of the first emission unit.

19 Claims, 8 Drawing Sheets

(56) References Cited

U.S. PATENT DOCUMENTS

| | | | |
|---|---|---|---|
| 2007/0108443 A1* | 5/2007 | Kim | ............... H01L 27/3244 |
| | | | 257/40 |
| 2014/0354704 A1 | 12/2014 | Pak | |
| 2015/0015468 A1* | 1/2015 | Ko | ............... G09G 3/3233 |
| | | | 345/82 |
| 2017/0229056 A1* | 8/2017 | Li | ............... G09G 3/3233 |
| 2019/0325823 A1* | 10/2019 | Yang | ............... G09G 3/3233 |
| 2022/0123026 A1 | 4/2022 | Oh et al. | |

FOREIGN PATENT DOCUMENTS

| | | |
|---|---|---|
| KR | 10-0722117 B1 | 5/2007 |
| KR | 10-1368049 B1 | 2/2014 |
| KR | 10-2014-0140968 A | 12/2014 |
| KR | 10-2020-0020328 A | 2/2020 |
| KR | 10-2020-0088954 A | 7/2020 |
| KR | 10-2020-0105598 A | 9/2020 |

\* cited by examiner

|  |  | COMPARISON EXAMPLE | EMBODIMENT |  |
|---|---|---|---|---|
| NUMBER OF TRs OF UNIT PIXEL | | 3 TRs | 4 TRs | |
| LOW GRAYSCALE | ex) Id | Id1 | 20nA | 10nA | AT LOW GRAYSCALE LEVEL, Id1<<Id2 |
| | | Id2 | 20nA | 30nA | |
| HIGH GRAYSCALE | ex) Id | Id1 | 1.0uA | 0.9uA | AT HIGH GRAYSCALE LEVEL, Id1 ~ Id2 |
| | | Id2 | 1.0uA | 1.1uA | |

| | | | COMPARISON EXAMPLE | EMBODIMENT | |
|---|---|---|---|---|---|
| | | | | ADD T4 DIODE | |
| LOW GRAYSCALE | ex) Id | Id1 | 20nA | 10nA | AT LOW GRAYSCALE LEVEL, Id1<<Id2 |
| | | Id2 | 20nA | 30nA | |
| HIGH GRAYSCALE | ex) Id | Id1 | 1.0uA | 0.6uA | AT HIGH GRAYSCALE LEVEL, Id1 < Id2 |
| | | Id2 | 1.0uA | 1.4uA | |

PIXEL AND DISPLAY DEVICE INCLUDING THE SAME

CROSS-REFERENCE TO RELATED APPLICATION

This application claims priority to, and the benefit of, Korean patent application number 10-2021-0031689 filed on Mar. 10, 2021, the entire disclosure of which is incorporated herein in its entirety by reference.

BACKGROUND

1. Field

Various embodiments of the present disclosure relate to a pixel and a display device including the pixel.

2. Related Art

With the growing interest in information displaying, and with the increasing demand for using a portable information medium, demand for display devices increases, and commercialization thereof is promoted.

SUMMARY

Various embodiments of the present disclosure are directed to a pixel capable of improving a color shift defect of a display device at a low grayscale level, and a display device including the pixel.

Embodiments of the present disclosure may provide for a pixel. The pixel may include a driving transistor including a gate electrode coupled to a first node, a first electrode coupled to a first power line, and a second electrode coupled to a second node, a control transistor including a gate electrode coupled to the first node, a first electrode coupled to the second node, and a second electrode that is different from the first electrode, a first emission unit including at least one light-emitting element coupled between the second electrode of the control transistor and a second power line, and a second emission unit including at least one light-emitting element coupled between the second node and the second power line, wherein the second electrode of the control transistor is coupled to a first electrode of the first emission unit.

The driving transistor may control a driving current flowing to the control transistor and to the second emission unit in response to a voltage of the first node.

The driving current may include a first driving current flowing through the control transistor and the first emission unit, and a second driving current flowing through the second emission unit.

A magnitude of the first driving current and a magnitude of the second driving current may be different from each other.

A magnitude of the first driving current may be less than a magnitude of the second driving current when the pixel is driven at a low grayscale level.

The pixel may further include a first scan line through which a first scan signal is supplied, a second scan line through which a second scan signal is supplied, a data line through which a data voltage is supplied, a sensing line through which a sensing voltage is supplied for a sensing period, a switching transistor including a gate electrode coupled to the first scan line, a first electrode coupled to the data line, and a second electrode coupled to the first node, and a sensing transistor including a gate electrode coupled to the second scan line, a first electrode coupled to the sensing line, and a second electrode coupled to the second node.

The pixel may further include a first storage capacitor coupled between the first node and the second node, and a second storage capacitor coupled between the first node and a first electrode of the first emission unit.

Embodiments of the present disclosure may provide for a display device. The display device may include a base layer, a semiconductor layer on the base layer and including a first semiconductor and a second semiconductor, a gate insulating layer covering the semiconductor layer, a gate electrode layer on the gate insulating layer and including a first gate electrode, which partially overlaps the first semiconductor, and a second gate electrode, which partially overlaps the second semiconductor, an interlayer insulating layer covering the gate electrode layer, and an upper electrode layer on the interlayer insulating layer and including a first source electrode coupled to a source region of the first semiconductor, a first drain electrode coupled to a drain region of the first semiconductor, and a second source electrode coupled to a source region of the second semiconductor, wherein the first semiconductor, the first gate electrode, the first source electrode, and the first drain electrode constitute a driving transistor, and wherein the second semiconductor, the second gate electrode, the second source electrode, and the first source electrode constitute a control transistor.

The first source electrode may extend from a drain electrode of the control transistor.

The second gate electrode may extend from the first gate electrode.

The second source electrode may be electrically coupled to the source region of the second semiconductor through a contact hole of the gate insulating layer and the interlayer insulating layer, wherein the first source electrode is electrically coupled to a drain region of the second semiconductor through a contact hole of the gate insulating layer and the interlayer insulating layer.

The display device may further include an overlapped metal layer on the base layer, and overlapping at least parts of the first semiconductor, the first gate electrode, and the first source electrode, and a buffer layer covering the overlapped metal layer.

The overlapped metal layer may be electrically coupled to the first source electrode through a contact hole of the buffer layer, the gate insulating layer, and the interlayer insulating layer.

The first source electrode may be implemented as a first storage electrode, wherein the first storage electrode and the first gate electrode overlap each other, thereby constituting a first storage capacitor.

The display device may further include a passivation layer covering the upper electrode layer, and a first emission unit and a second emission unit on the passivation layer, wherein the second source electrode is electrically coupled to a first electrode of the first emission unit through a contact hole of the passivation layer.

The first source electrode may be electrically coupled to a first electrode of the second emission unit through a contact hole of the passivation layer.

Embodiments of the present disclosure may provide for a pixel. The pixel may include a driving transistor including a gate electrode coupled to a first node, a first electrode coupled to a first power line, and a second electrode coupled to a second node, a control transistor including a gate electrode coupled to the second node, a first electrode coupled to the second node, and a second electrode different from the first electrode, a first emission unit including at least one light-emitting element coupled between the second electrode of the control transistor and a second power line, and a second emission unit including at least one light-emitting element coupled between the second node and the second power line, wherein the second electrode of the control transistor is coupled to a first electrode of the first emission unit.

The driving transistor may control a driving current flowing to the control transistor and to the second emission unit in response to a voltage of the first node.

The driving current may include a first driving current flowing through the control transistor and the first emission unit, and a second driving current flowing through the second emission unit.

A magnitude of the first driving current may be less than a magnitude of the second driving current when the pixel is driven at a low grayscale level.

DETAILED DESCRIPTION

Figure 1:
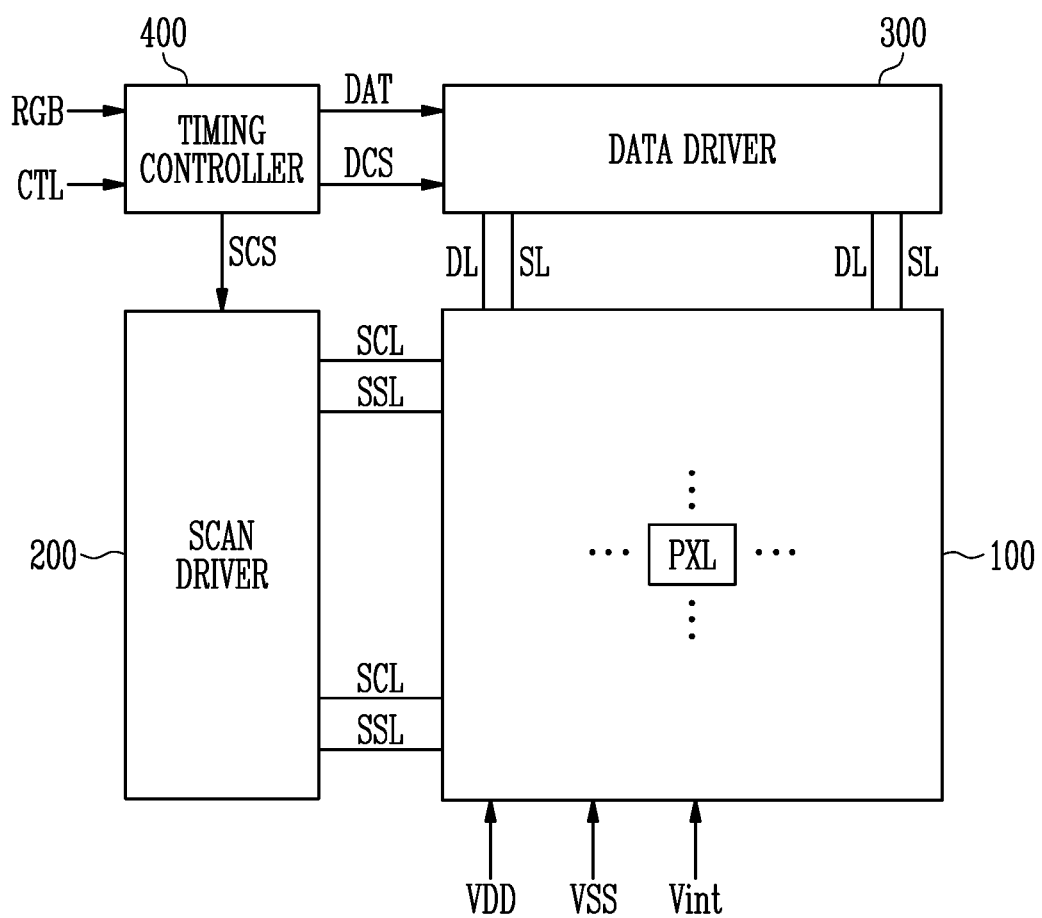
FIG. 1 is a block diagram illustrating a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device according to some embodiments.

Referring to FIG. 1, the display device according to some embodiments may include a display 100, a scan driver 200, a data driver 300, and a timing controller 400.

The display device may be a flat display device, a flexible display device, a curved display device, a foldable display device, a bendable display device, or a stretchable display device. Also, the display device may be applied to a transparent display device, a head-mounted display device, a wearable display device, and the like. Also, the display device may be applied to various electronic devices, such as a smartphone, a tablet PC, a smart pad, a TV, a monitor, and the like.

The display device may be implemented as a self-emissive display device including a plurality of self-emissive elements. For example, the display device may be an organic light emitting display device including organic light-emitting elements, a display device including inorganic light-emitting elements, or a display device including light-emitting elements formed of a combination of inorganic materials and organic materials. However, this is an example, and the display device may be implemented as a liquid crystal display device, a plasma display device, a quantum dot display device, or the like.

The display 100 includes a pixel PXL coupled to a data line DL, a first scan line SCL, a second scan line SSL, and a sensing line SL. The display 100 may include pixels PXL coupled to a plurality of data lines DL, a plurality of first scan lines SCL, a plurality of second scan lines SSL, and a plurality of sensing lines SL.

The pixel PXL may be supplied with a first driving voltage VDD, a second driving voltage VSS, and an initialization voltage Vint from the outside. The detailed configuration of the pixel PXL will be illustrated later in FIG. 2 and FIG. 8.

Meanwhile, although the first scan line SCL and the second scan line SSL are illustrated as being coupled to the pixel PXL in FIG. 1, the present disclosure is not limited thereto. According to some embodiments, one or more emission control lines and the like may be further formed in the display 100 so as to correspond to the circuit structure of the pixel PXL, and may be additionally coupled to the pixel PXL.

The scan driver 200 receives a scan control signal SCS from the timing controller 400. The scan driver 200 may supply a first scan signal to the respective first scan lines SCL and may supply a second scan signal to the respective second scan lines SSL in response to the scan control signal SCS.

The scan driver 200 may sequentially supply the first scan signal to the first scan lines SCL. For example, the first scan signal may be set to a gate-on voltage such that the transistor included in the pixel PXL is turned on. Also, the first scan signal may be used for applying a data voltage to the pixel PXL.

Also, the scan driver 200 may supply the second scan signal to the second scan lines SSL. For example, the second scan signal may be set to a gate-on voltage such that the transistor included in the pixel PXL is turned on. The second scan signal may be used for sensing (or extracting) the driving current flowing in the pixel PXL or for applying the initialization voltage Vint to the pixel PXL.

Meanwhile, although a single scan driver 200 is illustrated as outputting both the first scan signal and the second scan signal in FIG. 1, but it is not limited thereto. According to some embodiments, the scan driver 200 may include a first scan driver configured to supply the first scan signal to the display 100, and a second scan driver configured to supply the second scan signal to the display 100. That is, according to some embodiments, the first scan driver and the second scan driver may be implemented as separate components.

The data driver 300 receives a data control signal DCS from the timing controller 400. The data driver 300 may generate data signals (or data voltages) in response to the data control signal DCS, and may supply the generated data voltages to the respective data lines DL. That is, the data driver 300 may supply the data voltage to the display 100 for the display period of each of the pixels PXL in one frame period.

The data driver 300 may supply the initialization voltage Vint to the sensing lines SL for the display period. Also, the data driver 300 may sense the emission characteristics of each pixel PXL through the sensing lines SL after applying the initialization voltage Vint to the sensing lines SL in a sensing mode (or in a sensing period).

In some embodiments, the sensing lines SL are illustrated as being coupled to the data driver 300, but a separate sensing driver is provided in the display device according to some embodiments, whereby the data driver 300 and the sensing driver may be implemented as separate components.

The emission characteristics of the pixel PXL may include the threshold voltage of at least one transistor (e.g., a driving transistor) in the pixel PXL, mobility, and the characteristic information of a light-emitting element (e.g., a current-voltage characteristic).

The timing controller 400 may receive a control signal CTL and an image signal RGB from an image source, such as an external graphics device. The timing controller 400 may generate a data control signal DCS and a scan control signal SCS in response to the externally supplied control signal CTL. The data control signal DCS generated by the timing controller 400 may be supplied to the data driver 300, and the scan control signal SCS may be supplied to the scan driver 200. Also, the timing controller 400 may supply image data DAT, in which the externally supplied image signal RGB is rearranged, to the data driver 300.

Meanwhile, although the scan driver 200, the data driver 300, and the timing controller 400 are illustrated as being individually configured in FIG. 1, this is an example, and they are not limited thereto. For example, in some embodiments, at least one of the scan driver 200, the data driver 300, and the timing controller 400 may be provided in the display 100, or may be coupled to the display 100 by being implemented as an integrated circuit and embedded in a flexible printed circuit board. For example, the scan driver 200 may be provided in the display 100. Also, at least two of the scan driver 200, the data driver 300, and the timing controller 400 may be implemented as a single integrated circuit.

Hereinafter, a pixel included in a display device according to some embodiments will be described with reference to FIG. 2 and FIG. 3.

Figure 2:
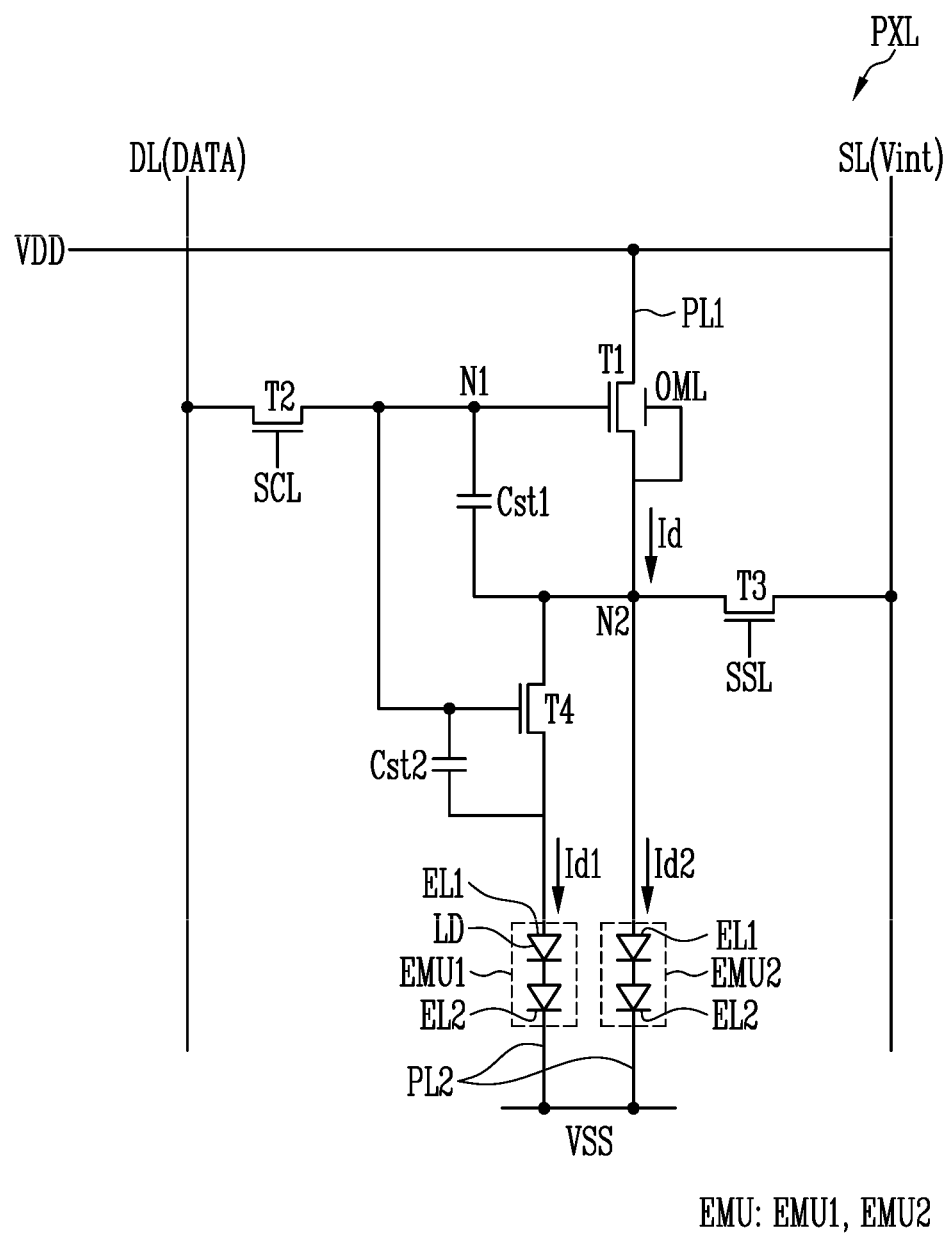
FIG. 2 is a circuit diagram of a pixel included in the display device of FIG. 1.
Figure 3:
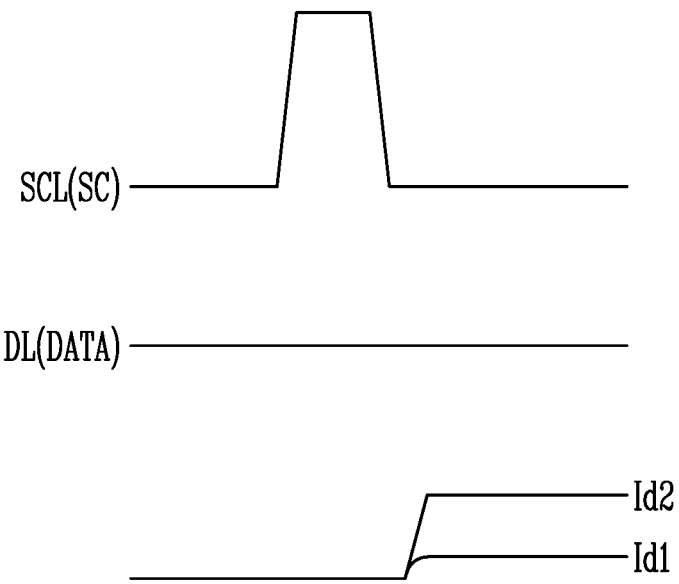
FIG. 3 is a timing diagram for driving the pixel illustrated in FIG. 2.

FIG. 2 is a circuit diagram of a pixel included in the display device of FIG. 1, and FIG. 3 is a timing diagram for driving the pixel illustrated in FIG. 2.

First, referring to FIG. 2, the pixel PXL may include a first transistor T1, a second transistor T2, a third transistor T3, a fourth transistor T4, a first storage capacitor Cst1, a second storage capacitor Cst2, a first emission unit EMU1, and a second emission unit EMU2. The first emission unit EMU1 and the second emission unit EMU2 may be collectively referred to as an emission unit EMU.

The first electrode of the first transistor (or driving transistor) T1 may be coupled to a first power line PL1, and the second electrode thereof may be coupled to the first electrode EU of the second emission unit EMU2 (or a second node N2). The gate electrode of the first transistor T1 may be coupled to a first node N1. In some embodiments, the first electrode may be a drain electrode, and the second electrode may be a source electrode.

The first transistor T1 may control the current amount of a driving current Id flowing to the emission unit EMU (e.g., the second emission unit EMU2) and the fourth transistor T4 in response to the voltage of the first node N1.

The driving current Id may include a first driving current Id1 and a second driving current Id2. The driving current Id may flow by being divided into the first driving current Id1 and the second driving current Id2 at the second node N2. The current flowing through the fourth transistor T4 and the first emission unit EMU1 is the first driving current Id1, and the current flowing through the second emission unit EMU2 is the second driving current Id2.

The first transistor T1 may include an overlapped metal layer OML. The gate electrode of the first transistor T1 and the overlapped metal layer OML may overlap each other with an insulating layer therebetween. In some embodiments, source-sync technology is applied by coupling the overlapped metal layer OML to the second electrode of the first transistor T1, whereby the threshold voltage of the first transistor T1 may be moved in a negative direction or in a positive direction. Because the first transistor T1 may optionally include the overlapped metal layer OML, the first transistor T1 might not include the overlapped metal layer OML according to some embodiments.

The first electrode of the second transistor (or switching transistor) T2 may be coupled to a data line DL, and the second electrode thereof may be coupled to the first node N1 (or the gate electrode of the first transistor T1). The gate electrode of the second transistor T2 may be coupled to a first scan line SCL. The second transistor T2 is turned on when a first scan signal (e.g., a high-level voltage) is supplied to the first scan line SCL, thereby transmitting a data voltage DATA from the data line DL to the first node N1.

The first electrode of the third transistor (or sensing transistor) T3 may be coupled to a sensing line SL, and the second electrode thereof may be coupled to the second node N2 (or to the second electrode of the first transistor T1). The gate electrode of the third transistor T3 may be coupled to a second scan line SSL. The third transistor T3 is turned on when a second scan signal (e.g., a high-level voltage) is supplied to the second scan line SSL for a sensing period (e.g., a predetermined sensing period), thereby electrically coupling the sensing line SL to the second node N2.

The first storage capacitor Cst1 is coupled between the first node N1 and the second node N2. The first storage capacitor Cst1 may be charged with the data voltage DATA corresponding to a data signal supplied to the first node N1 during one frame. Accordingly, the first storage capacitor Cst1 may store a voltage corresponding to the voltage difference between the first node N1 and the second node N2. For example, the first storage capacitor Cst1 may store the voltage corresponding to the difference between the data voltage DATA supplied to the gate electrode of the first transistor T1 and the initialization voltage Vint supplied to the second electrode of the first transistor T1.

The first electrode of the fourth transistor (or control transistor) T4 may be coupled to the second node N2, and the second electrode thereof may be coupled to the first electrode EL1 of the first emission unit EMU1. The gate electrode of the fourth transistor T4 may be coupled to the first node N1. Accordingly, due to the fourth transistor T4, the magnitude of the first driving current Id1 flowing to the first emission unit EMU1 may be relatively less than that of the second driving current Id2 flowing to the second emission unit EMU2.

The second storage capacitor Cst2 is coupled between the gate electrode of the fourth transistor T4 (or the first node N1) and the second electrode of the fourth transistor T4 (or the first electrode EL1 of the first emission unit EMU1). The first electrode of the second storage capacitor Cst2 is coupled to the first node N1, and the second electrode of the second storage capacitor Cst2 is coupled to the first electrode EL1 of the first emission unit EMU1, whereby the second storage capacitor Cst2 may store the difference between the voltage of the first node N1 and the voltage of the first electrode EL1 of the first emission unit EMU1. The present disclosure is not limited thereto, and the pixel PXL may omit the second storage capacitor Cst2 according to some embodiments.

The emission unit EMU may include a plurality of light-emitting elements LD coupled in parallel to each other between the first power line PL1 to which a first driving voltage VDD is applied, and a second power line PL2 to which a second driving voltage VSS is applied.

At least one light-emitting element LD may form the first emission unit EMU1, and at least one light-emitting element LD may form the second emission unit EMU2. The light-emitting elements LD forming the first emission unit EMU1 may be coupled in series to each other, and the light-emitting elements LD forming the second emission unit EMU2 may be coupled in series to each other.

The first emission unit EMU1 and the second emission unit EMU2 are coupled in parallel to each other, thereby forming a single emission unit EMU.

The emission unit EMU may include light-emitting elements LD coupled between the first electrode EL1, which is coupled to the second node N2 (or the second electrode of the fourth transistor T4), and the second electrode EL2 coupled to the second power line PL2. Here, the first electrode EL1 may be an anode electrode, and the second electrode EL2 may be a cathode electrode.

The first driving voltage VDD and the second driving voltage VSS may be different voltages such that the light-emitting elements LD emit light. For example, the first driving voltage VDD may be set to a high-potential voltage, and the second driving voltage VSS may be set to a low-potential voltage. Here, the voltage difference between the first and second driving voltages VDD and VSS may be set to be equal to or greater than the threshold voltage of the light-emitting elements LD for the emission period of the pixel PXL. Accordingly, the emission unit EMU may generate light with luminance (e.g., predetermined luminance) in response to the driving current Id supplied from the first transistor T1. For example, for one frame period, the first transistor T1 may supply the driving current Id corresponding to the grayscale value of the corresponding frame data to the emission unit EMU. The driving current Id supplied to the emission unit EMU may be divided to flow to the first emission unit EMU1 and the second emission unit EMU2. Accordingly, the light-emitting elements LD included in the first and second emission units EMU1 and EMU2 emit light with luminance corresponding to the first and second driving currents Id1 and Id2, whereby the emission unit EMU may emit light with luminance corresponding to the driving current Id.

When a display device expresses a low grayscale (that is, when it is driven at a low grayscale level), a data voltage DATA that is lower than an average is applied to the data line DL, and the driving current Id corresponding to the low data voltage DATA may be supplied to the emission unit EMU. Here, when the display device is driven using a pulse amplitude modulation method, a color shift defect may be caused. In the display device according to some embodiments, the first driving current Id1 and the second driving current Id2, respectively flowing in the first emission unit EMU1 and the second emission unit EMU2, are controlled to be different from each other, whereby a color shift defect may be reduced or prevented even though the display device expresses a low grayscale.

According to some embodiments, the emission unit EMU may include at least one light-emitting element LD arranged in a first direction and at least one light-emitting element arranged in a second direction that is opposite to the first direction.

Meanwhile, the circuit structure of the pixel PXL is not limited by FIG. 2 in the present disclosure. For example, the emission unit EMU may be located between the first power line PL1 and the first electrode of the first transistor T1.

Although the transistors are illustrated as n-type metal oxide semiconductors (NMOS) in FIG. 2, the present disclosure is not limited thereto. For example, at least one of the first to fourth transistors T1, T2, T3, and T4 may be implemented as a p-type metal oxide semiconductor (PMOS). Also, the first to fourth transistors T1, T2, T3, and T4 illustrated in FIG. 2 may be thin-film transistors including at least one of an oxide semiconductor, an amorphous silicon semiconductor, and a polysilicon semiconductor.

Referring to FIG. 2 and FIG. 3, when a first scan signal SC is applied to the gate electrode of the second transistor T2 through the first scan line SCL, the second transistor T2 is turned on, whereby the data voltage DATA may be transmitted to the first node N1.

Also, when a second scan signal SS is applied to the gate electrode of the third transistor T3 through the second scan line SSL, the third transistor T3 is turned on, whereby the initialization voltage Vint may be transmitted to the second node N2.

The first transistor T1 is turned on when the difference between the voltages transmitted to the first node N1 and the second node N2 is greater than a threshold voltage, thereby applying the driving current Id based on the first driving voltage VDD to the second node N2.

Because the second node N2 is coupled to the first electrode of the fourth transistor T4 and the first electrode EL1 of the second emission unit EMU2, the driving current Id may be divided to flow to the fourth transistor T4 and the second emission unit EMU2. The sum of the first driving current Id1 flowing to the first electrode of the fourth transistor T4 and the second driving current Id2 flowing to the first electrode EL1 of the second emission unit EMU2 may be equal to the current amount of the driving current Id.

For example, referring to a change in the voltage of each node when the display device displays a low grayscale, a data voltage DATA of about 2.02 V may be transmitted to the first node N1. Here, the gate-source voltage of the first transistor T1 may be about 0.36 V, and the gate-source voltage of the fourth transistor T4 may be about 0.29 V. Because the first transistor T1 is turned on, the driving current Id supplied to the second node N2 through the first transistor T1 may flow by being divided into the first driving current Id1 and the second driving current Id2. Also, because the fourth transistor T4 is turned on, the first driving current Id1 may flow to the first emission unit EMU1 through the fourth transistor T4. As the gate voltage of the fourth transistor T4 decreases, the current amount of the first driving current Id1 may decrease, but the current amount of the second driving current Id2 may increase. That is, the second driving current Id2 may have a greater value than the first driving current Id1.

Accordingly, even though a low grayscale is displayed in the display device, because the grayscale of each emission unit can be differently controlled, a color shift defect in the display device may be improved as a whole.

Hereinafter, the structures of a pixel and a display device including the pixel according to some embodiments will be described with reference to FIGS. 4 to 6.

Figure 4:
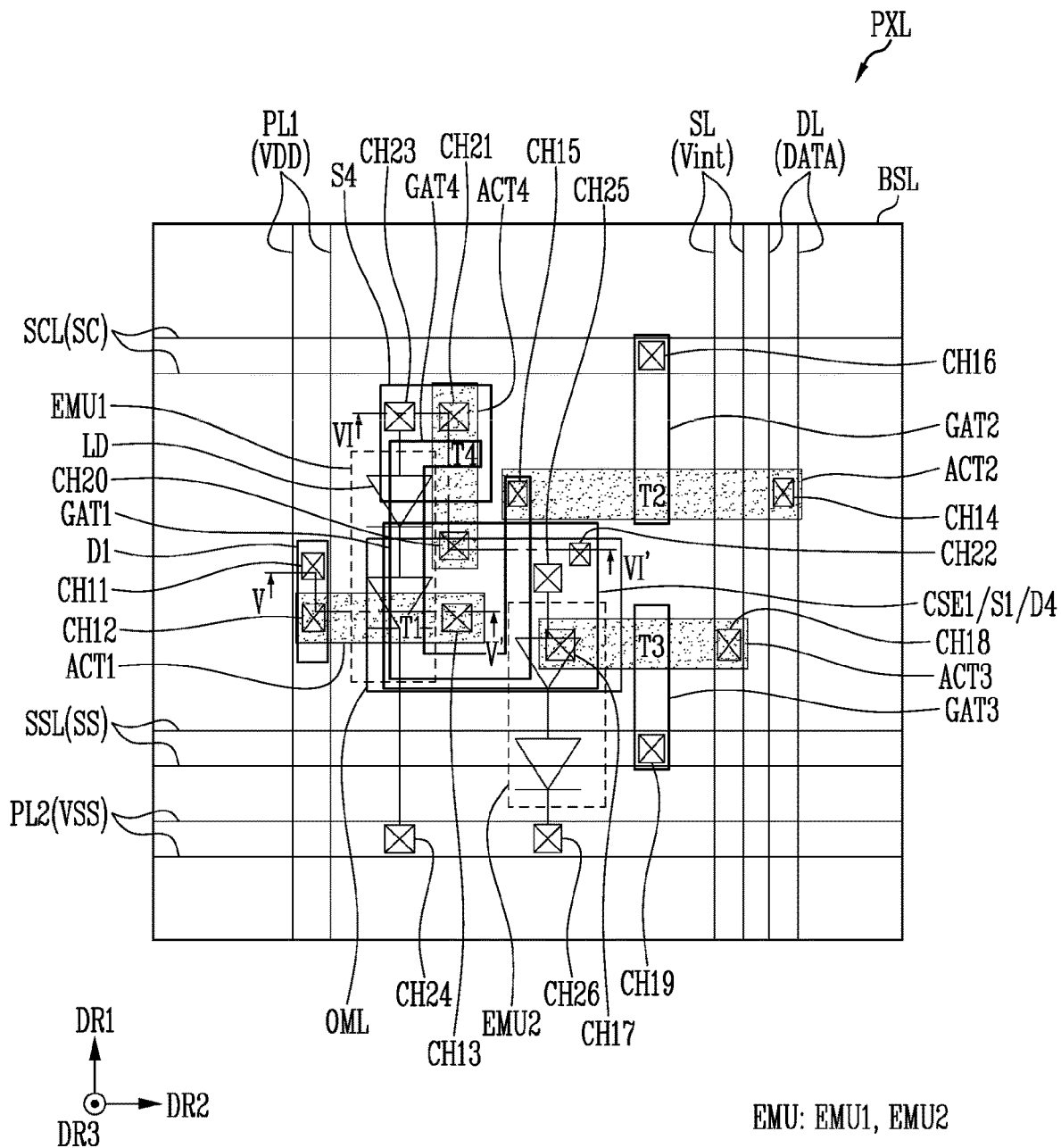
FIG. 4 is a schematic plan diagram of a pixel of a display device according to some embodiments.
Figure 5:
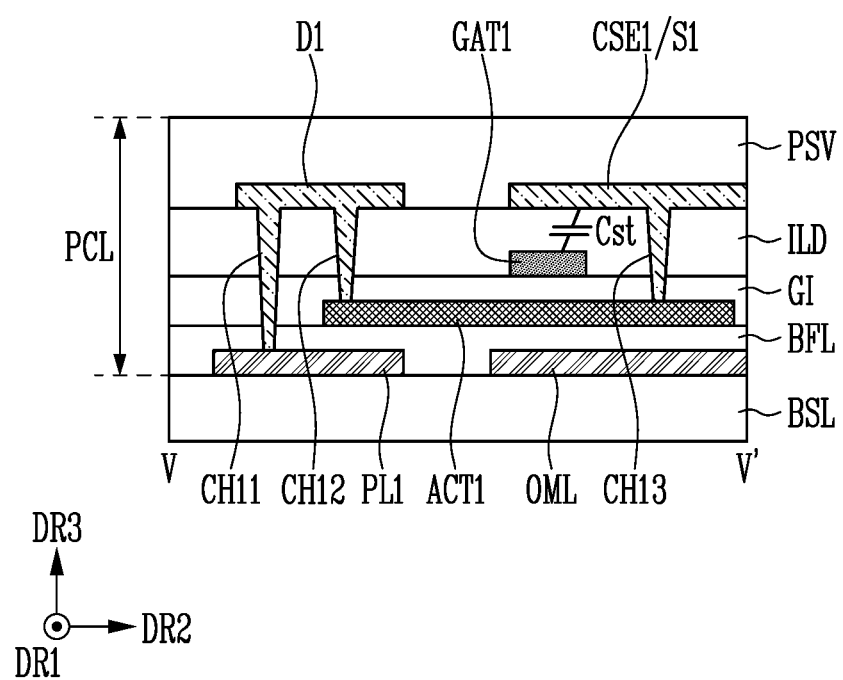
FIG. 5 is a sectional view taken along the line V-V' of FIG. 4.
Figures 6, 7:
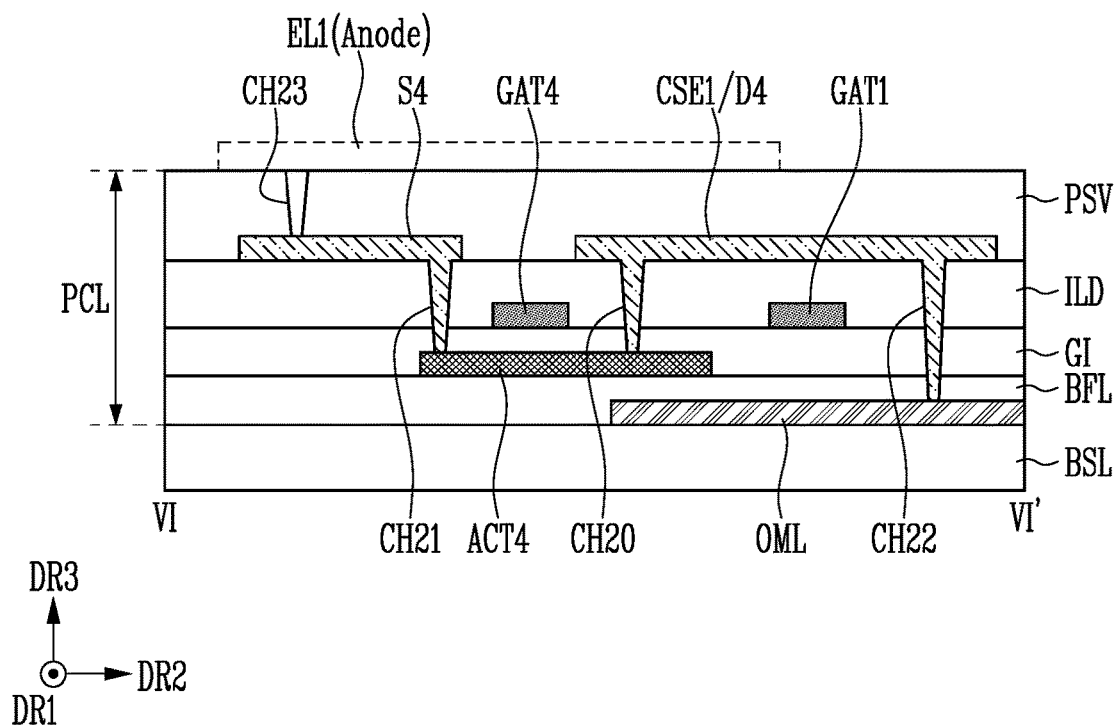
FIG. 6 is a sectional view taken along the line VI-VI' of FIG. 4.
FIG. 7 is a table illustrating an example of driving currents applied to the emission units of a display device according to a comparison example and a display device according to some embodiments.

FIG. 4 is a schematic plan diagram of a pixel of a display device according to some embodiments, FIG. 5 is a sectional view taken along the line V-V' of FIG. 4, and FIG. 6 is a sectional view taken along the line VI-VI' of FIG. 4.

Referring to FIG. 4, the display device according to some embodiments may include a lower electrode layer (PL1, DL, SL, and OML) located on a base layer BSL, a semiconductor layer (ACT1, ACT2, ACT3, and ACT4), a gate electrode layer (GAT1, GAT2, GAT3, and GAT4), an upper electrode layer (SCL, SSL, CSE1, S4, D1, PL2), and an emission unit EMU. The respective layers may be insulated from each other by interposing an insulating layer therebetween unless they are coupled to each other through a contact hole.

The lower electrode layer (PL1, DL, SL, and OML), the semiconductor layer (ACT1, ACT2, ACT3, and ACT4), the gate electrode layer (GAT1, GAT2, GAT3, and GAT4), and the upper electrode layer (SCL, SSL, CSE1, S4, D1, and PL2) may form a pixel circuit layer PCL, and the light emission unit EMU may be a portion of a display element layer located on the pixel circuit layer PCL.

The base layer BSL may be a rigid or flexible substrate or film, and the material and property are not For example limited. For example, the base layer BSL may be a rigid substrate made of glass or reinforced glass, a flexible substrate (or thin film) made of plastic or metal, or at least one insulating layer, and the material and/or property thereof is not For example limited.

Also, the base layer BSL may be transparent, but the present disclosure is not limited thereto. For example, the base layer BSL may be a transparent, translucent, opaque, or reflective base member.

The lower electrode layer (PL1, DL, SL, and OML) is located on the base layer BSL. The lower electrode layer (PL1, DL, SL, and OML) includes a first power line PL1, a data line DL, a sensing line SL, and an overlapped metal layer OML.

The first power line PL1 extends in a first direction DR1, and a first driving voltage VDD may be supplied to the pixel PXL through the first power line PL1.

The data line DL extends in the first direction DR1 while being spaced apart from the first power line PL1, and a data voltage DATA may be supplied to the pixel PXL through the data line DL.

The sensing line SL extends in the first direction DR1 while being spaced apart from the first power line PL1 and the data line DL, and an initialization voltage Vint may be supplied to the pixel PXL through the sensing line SL. Also, the characteristics of a driving transistor may be sensed through the sensing line SL for a sensing period (e.g., a predetermined sensing period).

The overlapped metal layer OML may have an island-shaped structure. The overlapped metal layer OML may be implemented as an island-shaped structure between the first power line PL1 and the sensing line SL, which are spaced apart from each other in a second direction DR2, such that the overlapped metal layer OML is spaced apart from the first power line PL1 and the sensing line SL.

The overlapped metal layer OML is located such that at least a portion thereof overlaps the first semiconductor ACT1 and the first gate electrode GAT1 of the first transistor T1 to be described later. The overlapped metal layer OML may be coupled to the first source electrode S1 of the first transistor T1 (or a first storage electrode CSE1 and the fourth drain electrode D4 of a fourth transistor T4) through the contact hole CH22 of a buffer layer BFL, a gate insulating layer GI, and an interlayer insulating layer ILD, as shown in FIG. 6. Here, the first source electrode S1 may be the same component as the above-described second electrode of the first transistor T1 of FIG. 2, and the fourth drain electrode D4 may be the same component as the above-described first electrode of the fourth transistor T4 of FIG. 2.

The buffer layer BFL is located on the base layer BSL and the lower electrode layer (PL1, DL, SL, and OML). The buffer layer BFL may cover the lower electrode layer (PL1, DL, SL, and OML) and the base layer BSL. The buffer layer BFL may reduce or prevent impurities diffusing from the outside into the pixel circuit layer PCL. The buffer layer BFL may include at least one of a silicon nitride ($SiN_x$), a silicon oxide ($SiO_x$), a silicon oxynitride ($SiO_xN_y$), and a metal oxide, such as an aluminum oxide ($AlO_x$) or the like. According to some embodiments, the buffer layer BFL may be omitted.

The semiconductor layer (ACT1, ACT2, ACT3, and ACT4) is located on the buffer layer BFL. The semiconductor layer (ACT1, ACT2, ACT3, and ACT4) includes the semiconductors of the first, second, third, and fourth transistors T1, T2, T3, and T4, and the semiconductors of the respective transistors include the channels of the first transistor T1, the second transistor T2, the third transistor T3, and the fourth transistor T4.

For example, the first semiconductor ACT1 is the semiconductor of the first transistor T1, and includes a channel area, and a source region and a drain region respectively located on the opposite sides of the channel area. The second semiconductor ACT2 is the semiconductor of the second transistor T2, and includes a channel area, and a source region and a drain region respectively located on the opposite sides of the channel area. The third semiconductor ACT3 is the semiconductor of the third transistor T3, and includes a channel area, and a source region and a drain region respectively located on the opposite sides of the channel area. The fourth semiconductor ACT4 is the semiconductor of the fourth transistor T4, and includes a channel area, and a source region and a drain region respectively located on the opposite sides of the channel area.

The source region and the drain region of the semiconductor layer (ACT1, ACT2, ACT3, and ACT4) are electrically coupled to a source electrode and a drain electrode, respectively. That is, the source region and the drain region may extend, and may be electrically coupled to another layer through the respective contact holes.

The semiconductor layer (ACT1, ACT2, ACT3, and ACT4) may include at least one of polysilicon, amorphous silicon, and an oxide semiconductor.

The gate insulating layer GI is located on the semiconductor layer (ACT1, ACT2, ACT3, and ACT4) and the buffer layer BFL. The gate insulating layer GI covers the semiconductor layer (ACT1, ACT2, ACT3, and ACT4) and the buffer layer BFL. The gate insulating layer GI may include an inorganic material. For example, the gate insulating layer GI may include at least one of a silicon nitride ($SiN_x$), a silicon oxide ($SiO_x$), a silicon oxynitride ($SiO_xN_y$), and an aluminum oxide ($AlO_x$). According to some embodiments, the gate insulating layer GI may alternatively include an organic material.

The gate electrode layer (GAT1, GAT2, GAT3, and GAT4) is located on the gate insulating layer GI. The gate electrode layer (GAT1, GAT2, GAT3, and GAT4) includes the first gate electrode GAT1, a second gate electrode GAT2, a third gate electrode GAT3, and a fourth gate electrode GAT4. The gate electrodes form the gate electrodes of the respective transistors.

The first gate electrode GAT1 may partially extend in the first direction DR1, may partially extend in the second direction DR2, and may be in a bent shape. The first gate electrode GAT1 overlaps the first semiconductor ACT1, and the first gate electrode GAT1 and the first semiconductor ACT1 may cross each other. That is, the parts overlapping each other by crossing with each other are the part of the first gate electrode GAT1 extending in the first direction DR1 and the part of the first semiconductor ACT1 extending in the second direction DR2.

The first gate electrode GAT1 overlaps the first storage electrode CSE1 (or the first source electrode S1 of the first transistor T1 and the fourth drain electrode D4 of the fourth transistor T4), thereby forming the first storage capacitor (Cst1, cf. FIG. 2).

The second gate electrode GAT2 partially extends in the first direction DR1. The second gate electrode GAT2 overlaps the second semiconductor ACT2, and the second gate electrode GAT2 and the second semiconductor ACT2 may cross with each other. That is, the parts overlapping each other by crossing with each other are the part of the second gate electrode GAT2 extending in the first direction DR1 and the part of the second semiconductor ACT2 extending in the second direction DR2.

The second gate electrode GAT2 overlaps the first scan line SCL to be described later. The second gate electrode GAT2 may receive a first scan signal SC from the first scan line SCL through a contact hole CH16 in the part overlapping the first scan line SCL.

The third gate electrode GAT3 partially extends in the first direction DR1. The third gate electrode GAT3 and the third semiconductor ACT3 may overlap each other.

The third gate electrode GAT3 overlaps the second scan line SSL to be described later. The third gate electrode GAT3 may receive a second scan signal SS from the second scan line SSL through a contact hole CH19 in the part overlapping the second scan line SSL.

The fourth gate electrode GAT4 extends from the first gate electrode GAT1, and the fourth gate electrode GAT4 overlaps the fourth semiconductor ACT4. A single gate electrode may be referred to as the first gate electrode GAT1 and the fourth gate electrode GAT4 depending on the disposition. That is, a part of the gate electrode overlapping the first semiconductor ACT1 may be referred to as the first gate electrode GAT1, and a part of the gate electrode overlapping the fourth semiconductor ACT4 may be referred to as the fourth gate electrode GAT4.

The interlayer insulating layer ILD is located on the gate electrode layer (GAT1, GAT2, GAT3, and GAT4) and the gate insulating layer GI. The interlayer insulating layer ILD covers the gate electrode layer (GAT1, GAT2, GAT3, and GAT4) and the gate insulating layer GI.

The interlayer insulating layer ILD may include the same material as the gate insulting layer GI, and may include, for example, at least one of a silicon nitride ($SiN_x$), a silicon oxide ($SiO_x$), a silicon oxynitride ($SiO_xN_y$), and an aluminum oxide ($AlO_x$).

The upper electrode layer (SCL, SSL, CSE1, S4, D1, and PL2) is located on the interlayer insulating layer ILD. The upper electrode layer (SCL, SSL, CSE1, S4, D1, and PL2) includes the first scan line SCL, the second scan line SSL, the first storage electrode CSE1, a fourth source electrode S4, a first drain electrode D1, and a second power line PL2.

The first scan line SCL extends in the second direction DR2, and the first scan signal SC may be applied to the pixel PXL through the first scan line SCL. For example, the first scan signal SC may be applied from the first scan line SCL to the second gate electrode GAT2 through the contact hole CH16.

The second scan line SSL extends in the second direction DR2, and the second scan signal SS may be applied to the pixel PXL through the second scan line SSL. For example, the second scan signal SS may be applied from the second scan line SSL to the third gate electrode GAT3 through the contact hole CH19.

The first storage electrode CSE1 may have an island-shaped structure. The first storage electrode CSE1 overlaps the overlapped metal layer OML. Also, the first storage electrode CSE1 overlaps the first gate electrode GAT1. Accordingly, the first storage electrode CSE1 may form the first storage capacitor (Cst1, cf. FIG. 2) in the part overlapping the first gate electrode GAT1. Here, the first gate electrode GAT1 may be alternatively referred to as a second storage electrode.

The first storage electrode CSE1 may be the first source electrode S1 of the first transistor T1. The first source electrode S1 of the first transistor T1 may be coupled to the overlapped metal layer OML through the contact hole CH22. Accordingly, the first source electrode S1 may form the first storage capacitor Cst1 in the part overlapping the first gate electrode GAT1 of the first transistor T1.

The first storage electrode CSE1 may be the fourth drain electrode D4 of the fourth transistor T4. That is, the first source electrode S1 may be implemented as the fourth drain electrode D4 of the fourth transistor T4.

The fourth source electrode S4 is the source electrode of the fourth transistor T4. The fourth source electrode S4 may be coupled to the source region of the fourth semiconductor ACT4 through a contact hole CH21.

Also, the fourth source electrode S4 may be coupled to the first electrode (or the anode electrode) of a first emission unit EMU1 through a contact hole CH23. Accordingly, the first electrode (EL1, cf. FIG. 2) of the first emission unit EMU1 may receive a first driving current (Id1, cf. FIG. 2) from the fourth transistor T4.

The first drain electrode D1 is the drain electrode of the first transistor T1. The first drain electrode D1 is located such that at least a portion thereof overlaps the first power line PL1 and the first semiconductor ACT1. The first drain electrode D1 may be coupled to the drain region of the first semiconductor ACT1 through a contact hole CH12, and the first drain electrode D1 may be coupled to the first power line PL1 through the contact hole CH11. Accordingly, the first driving voltage VDD applied through the first power line PL1 may be transmitted to the first drain electrode D1 and the drain region of the first semiconductor ACT1.

The second power line PL2 extends in the second direction DR2, and a second driving voltage VSS may be applied to the pixel PXL through the second power line PL2. For example, the second driving voltage VSS may be applied to the first emission unit EMU1 through a contact hole CH24, and the second driving voltage VSS may be applied to a second emission unit EMU2 through a contact hole CH26.

A passivation layer PSV is located on the upper electrode layer (SCL, SSL, CSE1, S4, D1, and PL2) and the interlayer insulating layer ILD. The passivation layer PSV covers the upper electrode layer (SCL, SSL, CSE1, S4, D1, and PL2) and the interlayer insulating layer ILD. The passivation layer PSV may be configured as a single layer or as a plurality of layers, and may include an inorganic insulating material or an organic insulating material. For example, the passivation layer PSV may include at least one of polyacrylates resin, epoxy resin, phenolic resin, polyamides resin, and/or polyimides resin.

The first electrode (EL1, cf. FIG. 2) of the first emission unit EMU1 may be coupled to the fourth source electrode S4 of the fourth transistor T4 through the contact hole CH23 of the passivation layer PSV. The second electrode (EL2, cf. FIG. 2) of the first emission unit EMU1 may be coupled to the second power line PL2 through the contact hole CH24 of the passivation layer PSV. Accordingly, a current based on the first driving voltage VDD and the second driving voltage VSS may be applied to the first emission unit EMU1, and the light-emitting element LD of the first emission unit EMU1 may emit light with luminance corresponding to the first driving current (Id1, cf. FIG. 2).

Also, the first electrode (EL1, cf. FIG. 2) of the second emission unit EMU2 may be coupled to the first source electrode S1 of the first transistor T1 (or the first storage electrode CSE1) through the contact hole CH25 of the passivation layer PSV. The second electrode (EL2, cf. FIG. 2) of the second emission unit EMU2 may be coupled to the second power line PL2 through the contact hole CH26 of the passivation layer PSV. Accordingly, a current based on the first driving voltage VDD and the second driving voltage VSS may be applied to the second emission unit EMU2, and the light-emitting element LD of the second emission unit EMU2 may emit light with luminance corresponding to a second driving current (Id2, cf. FIG. 2).

The display device according to some embodiments includes the fourth transistor T4, and may control the respective driving currents applied to the first emission unit EMU1 and the second emission unit EMU2 to be different from each other. Accordingly, when the display device expresses a low grayscale (that is, is driven at a low grayscale level), a current that is less than the current applied to the second emission unit EMU2 is applied to the first emission unit EMU1, and a relatively large current is applied to the second emission unit EMU2, whereby a color shift defect in the display device may be improved as a whole.

Hereinafter, the specific values of a first driving current and a second driving current applied to a display device will be described with reference to FIG. 7.

FIG. 7 is a table illustrating an example of driving currents applied to the emission units of a display device according to a comparison example and a display device according to some embodiments.

Referring to FIG. 7, the display device according to a comparison example may include a first transistor, a second transistor, and a third transistor in a single pixel PXL. Here, the first transistor, the second transistor, and the third transistor may be the above-described first to third transistors T1, T2, and T3 of FIG. 2. Also, a plurality of light-emitting elements may be coupled to the second electrode of the first transistor T1. Therefore, the current amount of the driving current Id flowing to the plurality of light-emitting elements LD may be controlled through the first transistor T1.

In the comparison example, the plurality of light-emitting elements may be coupled in parallel to each other. The plurality of light-emitting elements LD coupled in parallel to each other may form the first emission unit EMU1 and the second emission unit EMU2, as illustrated in FIG. 2. However, in the display device according to the comparison example, both the first electrode EL1 of the first emission unit EMU1 and the first electrode EU of the second emission unit EMU2 may be coupled to the second electrode of the first transistor T1. Therefore, in the comparison example, the first driving current Id1 applied to the first emission unit EMU1 may be equal to the second driving current Id2 applied to the second emission unit EMU2. For example, when a display device expresses a low grayscale, the value of each of the first driving current Id1 and the second driving current Id2 may be about 20 nA. Also, when the display device expresses a high grayscale, the value of each of the first driving current Id1 and the second driving current Id2 may be about 1 µA.

On the other hand, the display device according to some embodiments may include a first transistor, a second transistor, a third transistor, and a fourth transistor in a single pixel PXL. Here, the first transistor, the second transistor, the third transistor, and the fourth transistor may be the above-described first to fourth transistors T1, T2, T3, and T4 of FIG. 2.

Referring to the above-described FIG. 2, a plurality of light-emitting elements LD coupled in parallel to each other may form the first emission unit EMU1 and the second emission unit EMU2 in some embodiments. The first emission unit EMU1 may be coupled between the fourth transistor T4 and the second power line PL2, and the second emission unit EMU2 may be coupled between the first transistor T1 and the second power line PL2. Accordingly, the first driving current Id1 applied to the first emission unit EMU1 may be different from the second driving current Id2 applied to the second emission unit EMU2.

For example, when the display device expresses a low grayscale, the first driving current Id1 may be about 10 nA and the second driving current Id2 may be about 30 nA in some embodiments. Also, when the display device expresses a high grayscale, the first driving current Id1 may be about 0.9 µA, and the second driving current Id2 may be about 1.1 µA.

Accordingly, the display device according to some embodiments controls the currents applied to the first emission unit EMU1 and the second emission unit EMU2 to be different from each other by adding the fourth transistor T4, and applies more driving current to the second emission unit EMU2 than the first emission unit EMU1 when the display device expresses a low grayscale, thereby improving a color shift defect of the display device.

Hereinafter, a pixel of a display device according to some embodiments will be described with reference to FIG. 8.

Figure 8:
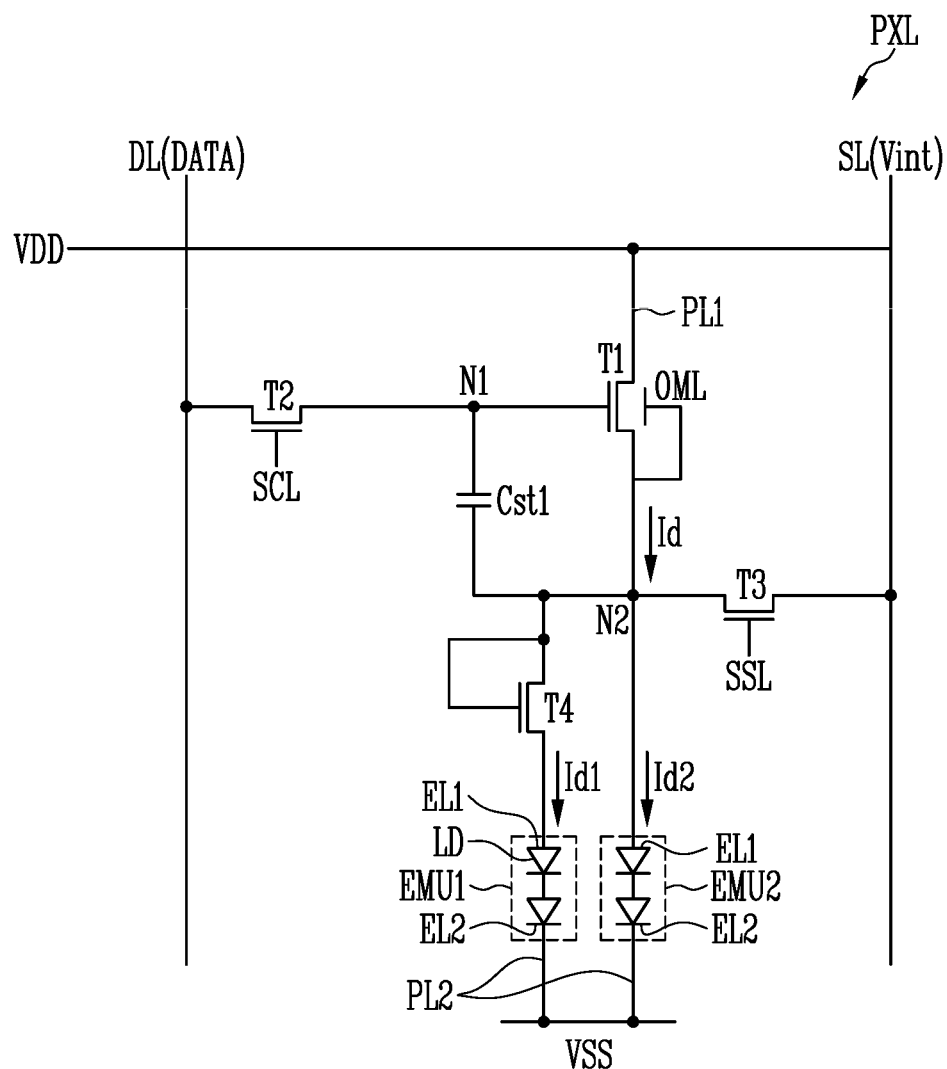
FIG. 8 is a circuit diagram of a pixel included in the display device of FIG. 1.

FIG. 8 is a circuit diagram of a pixel included in the display device of FIG. 1. FIG. 8 is similar to the circuit diagram of a pixel illustrated in FIG. 2, and thus a description will be made with focus on the difference.

Referring to FIG. 8, the pixel PXL may include a first transistor T1, a second transistor T2, a third transistor T3, a fourth transistor T4, a first storage capacitor Cst1, a first emission unit EMU1, and a second emission unit EMU2.

The first transistor T1 may control the current amount of a driving current Id flowing to an emission unit EMU and the fourth transistor T4 in response to the voltage of a first node N1.

The second transistor T2 is turned on when a first scan signal (e.g., a high-level voltage) is supplied to a first scan line SCL, thereby transmitting a data voltage DATA from a data line DL to the first node N1.

The third transistor T3 is turned on when a second scan signal (e.g., a high-level voltage) is supplied to a second scan line SSL for a sensing period (e.g., a predetermined sensing period), thereby electrically coupling a sensing line SL to a second node N2.

The first storage capacitor Cst1 may store a voltage corresponding to the voltage difference between the first node N1 and the second node N2.

The first electrode of the fourth transistor T4 may be coupled to the second node N2, and the second electrode thereof may be coupled to the first electrode EL1 of the first emission unit EMU1. The gate electrode of the fourth transistor T4 may be coupled to the second node N2. That is, according to some embodiments, the fourth transistor T4 may be implemented as a diode element.

At least one light-emitting element LD may form the first emission unit EMU1, and at least one light-emitting element LD may form the second emission unit EMU2. The light-emitting elements LD forming the first emission unit EMU1 may be coupled in series to each other, and the light-emitting elements LD forming the second emission unit EMU2 may be coupled in series to each other.

The emission unit EMU may include the light-emitting elements LD coupled between the first electrode EL1, which is coupled to the second node N2 (or the second electrode of the fourth transistor T4), and a second electrode EL2 coupled to a second power line PL2. Here, the first electrode EL1 may be an anode electrode, and the second electrode EL2 may be a cathode electrode.

Because the second node N2 is coupled to the first electrode of the fourth transistor T4 and the first electrode EL1 of the second emission unit EMU2, the driving current Id may flow to the first electrode of the fourth transistor T4 and the first electrode EL1 of the second emission unit EMU2 by being divided.

For example, referring to a change in the voltage of each node when the display device displays a low grayscale, a data voltage DATA of about 2.02 V may be transmitted to the first node N1. Here, the gate-source voltage of the first transistor T1 may be about 0.35 V, and the gate-source voltage of the fourth transistor T4 may be about 0.29 V. Because the first transistor T1 is turned on, the driving current Id supplied to the second node N2 through the first transistor T1 may flow by being divided into the first driving current Id1 and the second driving current Id2. Also, because the fourth transistor T4 is turned on, the first driving current Id1 may flow to the first emission unit EMU1 through the fourth transistor T4. As the gate voltage of the fourth transistor T4 decreases, the current amount of the first driving current Id1 may decrease, but the current amount of the second driving current Id2 may increase. That is, the second driving current Id2 may have a greater value than the first driving current Id1.

Accordingly, even though a low grayscale is displayed in the display device, the grayscales of the respective emission units may be differently controlled, whereby a color shift defect in the display device may be improved as a whole.

Hereinafter, the specific values of a first driving current and a second driving current applied to a display device will be described with reference to FIG. 9.

Figures 9, 10:
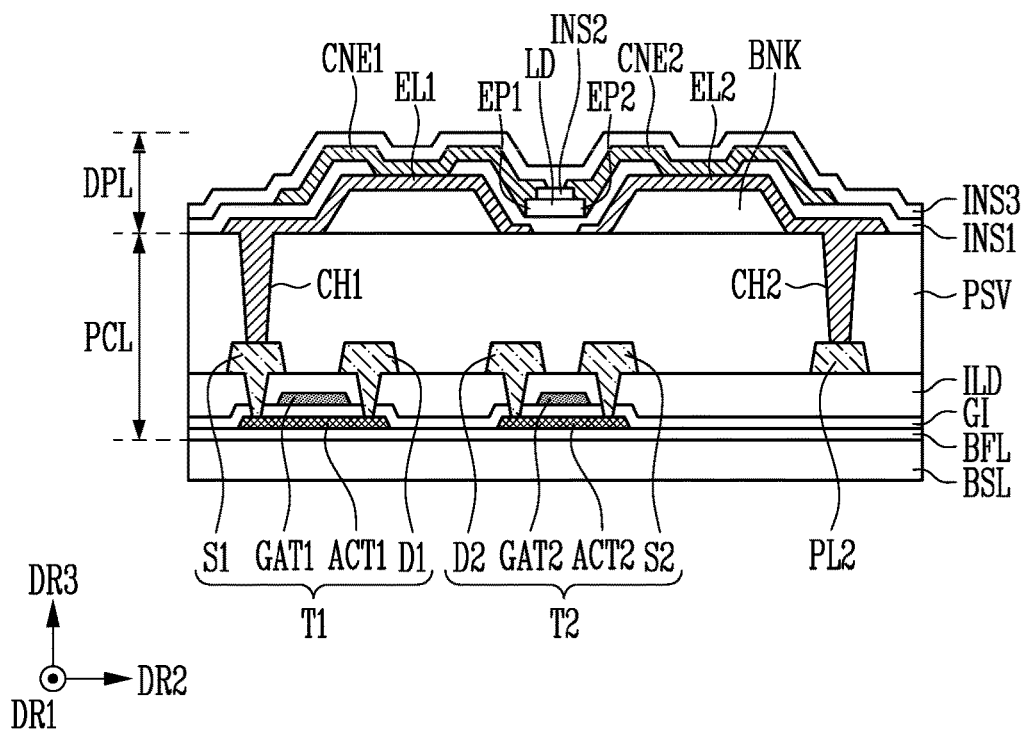
FIG. 9 is a table illustrating an example of driving currents applied to the emission units of a display device according to a comparison example and a display device according to some embodiments.
FIG. 10 is a sectional view simply illustrating a display device according to some embodiments.

FIG. 9 is a table illustrating an example of driving currents applied to the emission units of a display device according to a comparison example and a display device according to some embodiments.

Referring to FIG. 9, the display device according to a comparison example may include a first transistor, a second transistor, and a third transistor in a single pixel PXL. Here, the first transistor, the second transistor, and the third transistor may be the above-described first to third transistors T1, T2, and T3 of FIG. 8.

In the comparison example, a plurality of light-emitting elements may be coupled in parallel to each other. The plurality of light-emitting elements LD coupled in parallel to each other may form the first emission unit EMU1 and the second emission unit EMU2, as illustrated in FIG. 8. However, in the display device according to the comparison example, both the first electrode EL1 of the first emission unit EMU1 and the first electrode EU of the second emission unit EMU2 may be coupled to the second electrode of the first transistor T1. Therefore, the first driving current Id1 applied to the first emission unit EMU1 may be equal to the second driving current Id2 applied to the second emission unit EMU2 in the comparison example.

For example, when the display device expresses a low grayscale, the value of each of the first driving current Id1 and the second driving current Id2 may be about 20 nA. Also, when the display device expresses a high grayscale, the value of each of the first driving current Id1 and the second driving current Id2 may be about 1 μA.

On the other hand, the display device according to some embodiments may include a first transistor, a second transistor, a third transistor, and a fourth transistor in a single pixel PXL. Here, the first transistor, the second transistor, the third transistor, and the fourth transistor may be the above-described first to fourth transistors T1, T2, T3, and T4 of FIG. 2.

In some embodiments, a plurality of light-emitting elements may be coupled in parallel to each other. The plurality of light-emitting elements LD coupled in parallel to each other may form a first emission unit EMU1 and a second emission unit EMU2. As illustrated in FIG. 8, the first emission unit EMU1 may be coupled between the fourth transistor T4 and the second power line PL2, and the second emission unit EMU2 may be coupled between the first transistor T1 and the second power line PL2. Accordingly, the first driving current Id1 applied to the first emission unit EMU1 may be different from the second driving current Id2 applied to the second emission unit EMU2.

For example, when the display device expresses a low grayscale, the first driving current Id1 may be about 10 nA and the second driving current Id2 may be about 30 nA in some embodiments. Also, when the display device expresses a high grayscale, the first driving current Id1 may be about 0.6 μA and the second driving current Id2 may be about 1.4 μA.

Accordingly, the display device according to some embodiments controls the currents applied to the first emission unit EMU1 and the second emission unit EMU2 to be different from each other by adding the fourth transistor T4, and applies more driving current to the second emission unit EMU2 than the first emission unit EMU1 when the display device expresses a low grayscale, thereby improving a color shift defect of the display device.

Hereinafter, the display element layer of a display device according to some embodiments will be described with reference to FIG. 10.

FIG. 10 is a sectional view simply illustrating a display device according to some embodiments.

Referring to FIG. 10, the display device according to some embodiments may include a base layer BSL, a pixel circuit layer PCL, and a display element layer DPL. Here, because the base layer BSL and the pixel circuit layer PCL have structures similar to the above-described structures in FIG. 5 and FIG. 6, a description will be made with focus on the difference.

The pixel circuit layer PCL is located on the base layer BSL.

The pixel circuit layer PCL may include a first transistor T1, a second transistor T2, a second power line PL2, and a plurality of insulating layers BFL, GI, ILD and PSV.

The first transistor T1 may include a first semiconductor ACT1, a first gate electrode GAT1, a first source electrode S1, and a first drain electrode D1. The first transistor T1 may be the same component as the first transistor T1 described in FIG. 2 and FIG. 8. Also, the first semiconductor ACT1, the first gate electrode GAT1, the first source electrode S1, and the first drain electrode D1 may be the same components as the first semiconductor ACT1, the first gate electrode GAT1, the first source electrode S1, and the first drain electrode D1 described in FIGS. 4 to 6.

The second transistor T2 may include a second semiconductor ACT2, a second gate electrode GAT2, a second source electrode S2, and a second drain electrode D2. The second transistor T2 may be the same component as the second transistor T2 described in FIG. 2 and FIG. 8. Also, the second semiconductor ACT2, the second gate electrode GAT2, the second source electrode S2, and the second drain electrode D2 may be respectively the same components as the second semiconductor ACT2, the second gate electrode GAT2, the second source electrode S2, and the second drain electrode D2 described in FIGS. 4 to 6.

The second power line PL2 may be located at the same layer as the first source electrode S1 and the first drain electrode D1 of the first transistor T1 and the second source electrode S2 and the second drain electrode D2 of the second transistor T2. The second power line PL2 may be the same component as the second power line PL2 described in FIG. 2 and FIG. 8. On the other hand, the second power line PL2 has the same function as the second power line PL2 described in FIGS. 4 to 6, but may be the component located at a different layer.

The display element layer DPL is located on the pixel circuit layer PCL.

The display element layer DPL may include a bank BNK, a first electrode EL1, a second electrode EL2, a light-emitting element LD, a first contact electrode CNE1, a second contact electrode CNE2, a first insulating layer INS1, a second insulating layer INS2, and a third insulating layer INS3.

The bank BNK is located on a passivation layer PSV, and may be a structure for separation (segmentation) into respective pixel areas. The bank BNK may be formed of an organic material. The present disclosure is not limited thereto, and the bank BNK may be alternatively formed of an inorganic material.

The first electrode EL1 and the second electrode EL2 may be located on the bank BNK.

The first electrode EL1 may be physically and/or electrically coupled to the first source electrode S1 of the first transistor T1 through the first contact hole CH1 of the passivation layer PSV.

The second electrode EL2 may be physically and/or electrically coupled to the second power line PL2 through the second contact hole CH2 of the passivation layer PSV.

The first insulating layer INS1 may be located on the first electrode EL1 and the second electrode EL2 so as to cover at least parts of the first electrode EL1 and the second electrode EL2. The first insulating layer INS1 may be formed of an inorganic material.

The light-emitting element LD may be located between the first electrode EL1 and the second electrode EL2 in a plan view such that the first end EP1 thereof is directed toward the first electrode EU and such that the second end EP2 thereof is directed toward the second electrode EL2.

The light-emitting element LD may be a subminiature inorganic light emitting diode having a size ranging from a nanoscale to microscale, and having a structure formed by growing a nitride-based semiconductor.

Each of the light-emitting elements LD may output any one of a color of light (e.g., a predetermined color of light, a white light, and/or a blue light). In some embodiments, the light-emitting elements LD are provided such that they are sprayed into a solution, thereby being inserted into each pixel.

The second insulating layer INS2 is located on a portion of the light-emitting element LD. The second insulating layer INS2 may expose the first end EP1 and the second end EP2 of the light-emitting element LD, and may support the light-emitting element LD so as to be prevented from moving or otherwise secured.

The first contact electrode CNE1 is located on at least parts of the first insulating layer INS1, the first electrode EL1, and the light-emitting element LD such that it comes into contact with the first electrode EU and the first end EP1 of the light-emitting element LD.

The first contact electrode CNE1 comes into direct contact with the upper surface of the first electrode EL1, which is exposed by the first insulating layer INS1, and comes into direct contact with the first end EP1 of the light-emitting element LD, thereby transmitting the first driving voltage (VDD, cf. FIG. 2 and FIG. 8), which is transmitted to the first electrode EL1, to the first end EP1 of the light-emitting element LD.

The second contact electrode CNE2 is located on at least parts of the first insulating layer INS1, the second electrode EL2, and the light-emitting element LD such that it comes into contact with the second electrode EL2 and the second end EP2 of the light-emitting element LD.

The second contact electrode CNE2 comes into direct contact with the upper surface of the second electrode EL2, which is exposed by the first insulating layer INS1, and comes into direct contact with the second end EP2 of the light-emitting element LD, thereby transmitting the second driving voltage (VSS, cf. FIG. 2 and FIG. 8), which is transmitted to the second electrode EL2, to the second end EP2 of the light-emitting element LD.

The third insulating layer INS3 is located on the first contact electrode CNE1, the second insulating layer INS2, and the second contact electrode CNE2 so as to cover the first contact electrode CNE1, the second insulating layer INS2, and the second contact electrode CNE2. The third insulating layer INS3 may be formed of an inorganic material.

According to some embodiments, a pixel, and a display device including the pixel, are configured to control the driving currents applied to a first emission unit and a second emission unit to be different from each other by adding a control transistor. Accordingly, when the display device expresses a low grayscale, more driving current is applied to the second emission unit than the first emission unit, whereby a color shift defect of the display device may be improved.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the present disclosure. The scope of the present disclosure must be defined by the accompanying claims, with functional equivalents thereof to be included therein.

What is claimed is:

1. A pixel, comprising:
   a driving transistor comprising a gate electrode electrically and directly coupled to a first node, a first electrode electrically coupled to a first power line, and a second electrode electrically coupled to a second node;
   a control transistor comprising a gate electrode electrically and directly coupled to the first node, a first electrode electrically coupled to the second node, and a second electrode that is different from the first electrode;
   a first emission unit comprising at least one light-emitting element electrically coupled between the second electrode of the control transistor and a second power line; and
   a second emission unit comprising at least one light-emitting element electrically coupled between the second node and the second power line,
   wherein the second electrode of the control transistor is electrically coupled to a first electrode of the first emission unit.

2. The pixel according to claim 1, wherein the driving transistor controls a driving current flowing to the control transistor and to the second emission unit in response to a voltage of the first node.

3. The pixel according to claim 2, wherein the driving current comprises a first driving current flowing through the control transistor and the first emission unit, and a second driving current flowing through the second emission unit.

4. The pixel according to claim 3, wherein a magnitude of the first driving current and a magnitude of the second driving current are different from each other.

5. The pixel according to claim 3, wherein a magnitude of the first driving current is less than a magnitude of the second driving current when the pixel is driven at a low grayscale level.

6. The pixel according to claim 1, further comprising:
   a first scan line through which a first scan signal is supplied;
   a second scan line through which a second scan signal is supplied;
   a data line through which a data voltage is supplied;
   a sensing line through which a sensing voltage is supplied for a sensing period;
   a switching transistor comprising a gate electrode electrically coupled to the first scan line, a first electrode electrically coupled to the data line, and a second electrode electrically coupled to the first node; and
   a sensing transistor comprising a gate electrode electrically coupled to the second scan line, a first electrode electrically coupled to the sensing line, and a second electrode electrically coupled to the second node.

7. The pixel according to claim 1, further comprising:
   a first storage capacitor electrically coupled between the first node and the second node; and
   a second storage capacitor electrically coupled between the first node and a first electrode of the first emission unit.

8. A display device, comprising:
   a base layer;
   a semiconductor layer on the base layer and comprising a first semiconductor and a second semiconductor;
   a gate insulating layer covering the semiconductor layer;
   a gate electrode layer on the gate insulating layer and comprising:
      a first gate electrode, which partially overlaps the first semiconductor; and
      a second gate electrode, which partially overlaps the second semiconductor, extends from the first gate electrode, is integrally formed with the first gate electrode, and is configured to receive a same signal as the first gate electrode;
   an interlayer insulating layer covering the gate electrode layer; and an upper electrode layer on the interlayer insulating layer and comprising a first source electrode electrically coupled to a source region of the first semiconductor, a first drain electrode electrically coupled to a drain region of the first semiconductor, and a second source electrode electrically coupled to a source region of the second semiconductor, wherein the first semiconductor, the first gate electrode, the first source electrode, and the first drain electrode constitute a driving transistor, and wherein the second semiconductor, the second gate electrode, the second source electrode, and the first source electrode constitute a control transistor.

9. The display device according to claim 8, wherein the first source electrode extends from a drain electrode of the control transistor.

10. The display device according to claim 9, wherein the second source electrode is electrically coupled to the source region of the second semiconductor through a contact hole of the gate insulating layer and the interlayer insulating layer, and wherein the first source electrode is electrically coupled to a drain region of the second semiconductor through another contact hole of the gate insulating layer and the interlayer insulating layer.

11. The display device according to claim 8, further comprising:

an overlapped metal layer on the base layer, and overlapping at least parts of the first semiconductor, the first gate electrode, and the first source electrode; and a buffer layer covering the overlapped metal layer.

12. The display device according to claim 11, wherein the overlapped metal layer is electrically coupled to the first source electrode through a contact hole of the buffer layer, the gate insulating layer, and the interlayer insulating layer.

13. The display device according to claim 8, wherein the first source electrode is implemented as a first storage electrode, and wherein the first storage electrode and the first gate electrode overlap each other, thereby constituting a first storage capacitor.

14. The display device according to claim 8, further comprising:

a passivation layer covering the upper electrode layer; and a first emission unit and a second emission unit on the passivation layer, wherein the second source electrode is electrically coupled to a first electrode of the first emission unit through a contact hole of the passivation layer.

15. The display device according to claim 14, wherein the first source electrode is electrically coupled to a first electrode of the second emission unit through another contact hole of the passivation layer.

16. A pixel, comprising:

a driving transistor comprising a gate electrode electrically and directly coupled to a first node, a first electrode electrically coupled to a first power line, and a second electrode electrically coupled to a second node;

a control transistor comprising a gate electrode electrically and directly coupled to the second node, a first electrode electrically coupled to the second node, and a second electrode that is different from the first electrode;

a first emission unit comprising at least one light-emitting element electrically coupled between the second electrode of the control transistor and a second power line; and a second emission unit comprising at least one light-emitting element electrically coupled between the second node and the second power line, wherein the second electrode of the control transistor is electrically coupled to a first electrode of the first emission unit.

17. The pixel according to claim 16, wherein the driving transistor controls a driving current flowing to the control transistor and to the second emission unit in response to a voltage of the first node.

18. The pixel according to claim 17, wherein the driving current comprises a first driving current flowing through the control transistor and the first emission unit, and a second driving current flowing through the second emission unit.

19. The pixel according to claim 18, wherein a magnitude of the first driving current is less than a magnitude of the second driving current when the pixel is driven at a low grayscale level.

* * * * *